United States Patent [19]

Kudo et al.

[11] Patent Number: 4,805,183
[45] Date of Patent: Feb. 14, 1989

[54] DISTRIBUTED FEEDBACK SEMICONDUCTOR LASER DEVICE

[75] Inventors: Hiroaki Kudo, Tenri; Haruhisa Takiguchi; Shinji Kaneiwa, both of Nara; Toshihiko Yoshida, Tenri, all of Japan

[73] Assignee: Sharp Kabushiki Kaisha, Osaka, Japan

[21] Appl. No.: 140,465

[22] Filed: Jan. 4, 1988

[30] Foreign Application Priority Data

Jan. 7, 1987 [JP] Japan ................................. 62-1178

[51] Int. Cl.[4] .............................................. H01S 3/08
[52] U.S. Cl. ......................................... 372/96; 372/50
[58] Field of Search ................. 372/43, 48, 96, 19, 372/50

[56] References Cited

U.S. PATENT DOCUMENTS

| | | | |
|---|---|---|---|
| 4,045,749 | 8/1977 | Burnham et al. | 372/96 |
| 4,096,446 | 6/1978 | Haus et al. | 372/96 |
| 4,302,729 | 11/1981 | Burnham et al. | 372/96 |
| 4,665,528 | 5/1987 | Chinone et al. | 372/96 |

FOREIGN PATENT DOCUMENTS 0720591  3/1980  U.S.S.R. ............................. 372/96

*Primary Examiner*—William L. Sikes
*Assistant Examiner*—B. Randolph
*Attorney, Agent, or Firm*—Ciotti & Murashige, Irell & Manella

[57] ABSTRACT

A distributed feedback semiconductor laser device with a resonator comprising a multi-layered optical waveguide that contains an optical guiding area with a periodic corrugation, the optical guiding area being composed of at least two regions, a first region I and a second region II, wherein both the periodicity of the corrugation and the depth of each concave portion of the corrugation of the first region I of the optical guiding area are the same as those of the second region II of the optical guiding area, and moreover the thickness of the first region I of the optical guiding area is the same as that of the second region II of the optical guiding area, so that the effective refractive index of the first region I in the resonator direction becomes the same as that of the second region II in the resonator direction and the Bragg wavelength is maintained at a fixed level in the the resonator direction; and there is a difference in their refractive index at the interface between the first and second regions of the optical guiding area, so that an effective optical-phase shift takes place without changing the Bragg wavelength in the resonator direction.

4 Claims, 4 Drawing Sheets

DISTRIBUTED FEEDBACK SEMICONDUCTOR LASER DEVICE

BACKGROUND OF THE INVENTION

1. Field of the Invention

This invention relates to a distributed feedback semiconductor laser device that attains laser oscillation in a single longitudinal mode.

2. Description of the Prior Art

In a large-capacity light transfer system that has single-mode optical fibers and uses light with a long wavelength (e.g., 1.5–1.6 μm), laser devices oscillating in a single mode even at the time of highspeed direct modulation can be used as a light source. These kinds of laser devices are called dynamic singlemode lasers, examples of which are distributed Bragg reflection laser devices (DBR laser devices) and distributed feedback laser devices (DFB laser devices).

In general, in Fabry-Pérot resonance-type lasers, there are a number of longitudinal modes required to satisfy the phase conditions, and moreover there is no optical loss difference between the adjacent longitudinal modes, so that even though single-mode operation is achieved for a time, when there is high-speed direct modulation, the gain distribution changes remarkably, causing multi-mode operation and/or mode-hopping. When multi-mode operation takes place, beams with a number of wavelengths with different speeds of propagation are transmitted at the same time through the optical fibers, so that the resolution power of the signal decreases. When mode-hopping takes place, mode distribution noise occurs, resulting in the limitation of the transmission zone.

In order to solve the above-mentioned problems, DBR laser devices and DFB laser devices that can oscillate lasers in a single longitudinal mode have been developed.

FIG. 2 shows the structure in the vicinity of the resonator of a conventional DBR laser device, in which an optical waveguide 5 is disposed on both sides of the active region 4. The optical waveguide 5 has a diffraction grating, on its surface, with a periodically corrugated pattern by which the refractive index of the optical waveguide changes periodically. On the active region 4, there is provided an electrical current supply region. The DBR laser device with the above-mentioned structure oscillates laser light with an oscillation wavelength that is defined by both the periodicity of the diffraction grating formed on the optical waveguide 5 and the effective refractive index of the optical waveguide 5.

FIG. 3 shows the structure in the vicinity of the resonator region of a conventional DFB laser device, in which an optical waveguide 5 is disposed over the active region 4. The optical waveguide 5 has a diffraction grating, on its surface, with a periodically corrugated pattern on its surface by which the refractive index of the optical waveguide 5 changes periodically. This DFB laser device also oscillates laser light with an oscillation wavelength that is defined by both the periodicity of the diffraction grating and the effective refractive index of the optical waveguide 5. Since both the DBR laser device and the DFB laser device here, as shown in FIGS. 2 and 3, a corrugated structure (i.e., an optical waveguide with the diffraction grating), optical loss depends upon the wavelength. Thus, these laser devices can attain stabilized operating characteristics at a fixed wavelength that is determined by the size of the periodicity of the diffraction grating (diffraction intervals) and the effective refractive index of the optical waveguide.

However, the conventional DFB laser device with a built-in diffraction grating by which a longitudinal mode is regulated actually operates in two modes. That is, there is no operation mode when the lattice of the diffraction grating is located in such a manner that the phase difference that arises between the adjacent diffraction intervals of the diffraction grating is $\pi/2$, and when the lattice thereof is located in such a manner that the phase difference is in the vicinity of $\pm\pi$, there are operation modes with two equivalent gain threshold values.

In actual oscillation, the laser device oscillates in one or the other mode. However, it is difficult to obtain good reproducibility of oscillation in a single mode, because there is scattering of all of the parameters (for example, slipping of the corrugated pattern of the diffraction grating, and slipping of the layer thickness distribution), etc., in the production process for the laser device.

In order to control laser oscillation in the two longitudinal modes of the above-mentioned DFB laser device, a device structure such as that of FIG. 4 has been proposed in which there is a difference in phase of $\pi/2$ (a phase shift corresponding to $\frac{1}{4}$ of the wavelength) between the right-sided and the left-sided diffraction gratings in the center portion of the optical waveguide 5, so that the laser oscillation wavelength becomes equal to the Bragg wavelength. Another device structure such as that of FIG. 5 has been proposed in which the distribution of the equivalent refractive index Neq that is changed symmetrically in relation to the center of the axis in the axis direction of the resonator in the center area of the optical waveguide 5 over which a diffraction grating is formed, can be, for example, formed by changes in the composition of the optical waveguide, so that only one of the operation modes can be selected. Of these approaches, the laser structure having a phase-shifted diffraction grating makes it possible theoretically to oscillate at the Bragg wavelength by a resonator that is formed by the diffraction grating. However, the method, in which a photoresistive film is formed to achieve the corrugated pattern of a diffraction grating, and based on the exposure of the interference pattern of laser light onto the said photoresistive film, the phase shift is directly added to this interference pattern, has not yet actually been achieved. This is because it is technically very difficult to achieve a $\frac{1}{4}$ wavelength phase shift with regard to a diffraction grating having the pattern that changes periodically (i.e., peak→valley→valley→peak→valley) so as to obtain a diffraction grating having the pattern that changes periodically (e.g., peak→peak→valley→peak) due to the very small periodicity of the diffraction and the very narrow width of the peak portions. A method that is now known involves the use of two resists, positive and negative, and the formation of the laser light interference pattern on both the positive and the negative resistive films, by which the phases of these exposure regions are reversed, so that a phase shift of $\frac{1}{4}$ of the wavelength can take place. This method, like that mentioned above, is technically difficult for the same reasons that have been described. Moreover, the distribution of the equivalent refractive index Neq must be symmetrically formed, which makes the production method of the laser device complicated.

Another method, in which the thickness of the optical waveguide is altered to change the effective refractive index, thereby attaining a shift of the Bragg wavelength in the resonator, so that one of the two longitudinal modes can be selectively stressed, has been proposed. However, this method is also technically difficult for the reasons that since the thickness of the crystal layers is changed so as to change the effective refractive index and a diffraction grating is formed on the top of the crystal layers, the surface of the underlying layer on which the diffraction grating is formed is not flat, which makes difficult the formation of an accurate pattern for the diffraction grating.

SUMMARY OF THE INVENTION

The distributed feedback semiconductor laser device with a resonator of this invention, which overcomes the above-discussed and numerous other disadvantages and deficiencies of the prior art, comprises a multi-layered optical waveguide that contains an optical guiding area with a periodic corrugation, said optical guiding area being composed of at least two regions, a first region I and a second region II, wherein both the periodicity of the corrugation and the depth of each concave portion of the corrugation of the first region I of said optical guiding area are the same as those of the second region II of said optical guiding area, and moreover the thickness of the first region I of said optical guiding area is the same as that of the second region II of said optical guiding area, so that the effective refractive index of the first region I in the resonator direction becomes the same as that of the second region II in the resonator direction and the Bragg wavelength is maintained at a fixed level in the said resonator direction; and there is a difference in their refractive index at the interface between the first and second regions of said optical guiding area, so that an effective optical-phase shift takes place without changing the Bragg wavelength in the resonator direction.

In a preferred embodiment, the position of the interface between the first and second region of said optical guiding area is set arbitrarily.

In a preferred embodiment, the optical guiding area is an optical guiding layer.

In a preferred embodiment, the composition of the first region I of said optical guiding area is different from that of the second region II of said optical guiding area, which causes a difference in their refractive index between the first and second regions of said optical guiding area.

Thus, the invention described herein makes possible the objectives of (1) providing a phaseshifting type distributed feedback semiconductor laser device that attains laser oscillation in a stabilized single longitudinal mode; (2) providing a phaseshifting type distributed feedback semiconductor laser device in which the optical guiding area having a periodic corrugation on its surface is composed of at least two regions that have the same thickness and the same corrugation periodicity but have different refractive indexes, and accordingly the scattering of the laser devices based on a production process has no influence on the phase shift; (3) providing a phaseshifting type distributed feedback semiconductor laser device in which the phase shift does not depend upon a diffraction grating pattern (i.e., a periodic corrugation pattern), and accordingly optical loss in the region in which the phase shift arises can be minimal, which allows laser oscillation in a single longitudinal mode with excellent reproducibility; and (4) providing a phase-shifting type distributed feedback semiconductor laser device that can be readily produced by the use of the laser interference and exposure method.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS EXAMPLE

Figure 1A:
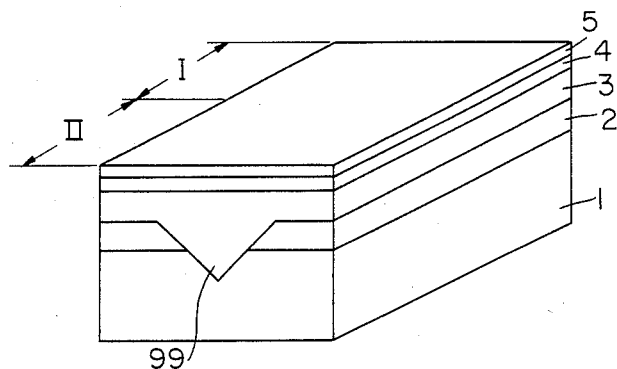
FIGS. 1A to 1F are perspective views showing a process for the production of a distributed feedback semiconductor laser device of this invention.

FIGS. 1A to 1F show a process for the production of a distributed feedback semiconductor laser device of this invention. This laser device is produced as follows:

As shown in FIG. 1A, on the (100) plane of a p-GaAs substrate 1, an n-current blocking layer 2 is epitaxially grown, first. Then, a V-channel 99 is formed by photolithography and a chemical etching technique in such a manner that it reaches the substrate 1 through the current blocking layer 2. Then, on the current blocking layer 2 including the V-channel 99, a p-$Ga_{1-x}Al_xAs$ cladding layer (x=0.5 to 0.6)3, a p-$Ga_{1-x}Al_xAs$ active layer (x=0.13; the thickness thereof being 0.1 $\mu$m)4, and an n-$IN_{1-x}Ga_xP_{1-y}As_y$ optical guiding layer (x=0.68 and y=0.36; the thickness thereof being 0.2 $\mu$m)5 are successively grown by liquid phase epitaxy.

Figure 1B:
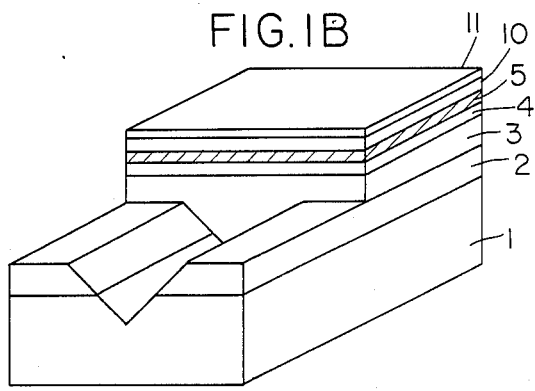

Thereafter, as shown in FIG. 1B, a $Si_3N_4$ film 10 is formed on the n-InGaPAs optical guiding layer 5 by plasma assisted chemical vapor deposition, followed by forming a photoresistive layer 11 on the said $Si_3N_4$ film 10. Then, a part of the photoresistive layer 11, which corresponds to a first region I of the optical guiding area, is retained without removal and the other part of the photoresistive layer 11, which corresponds to a second region II of the optical guiding area, is removed by photolithography. Then, the wafer of the second region II is removed from the $Si_3N_4$ film 10 the V-channeled substrate 1 by a chemical etching technique. Buffered hydrofluoric acid is used as an etchant for the removal of the $Si_3N_4$ film 10, an etchant containing saturated bromine water is used as an etchant for the removal of the InGaPAs optical guiding layer, ammonia is used for the removal of the GaAlAs active layer 4, and hydrofluoric acid is used for the removal of the GaAlAs cladding layer 3.

Figure 1C:
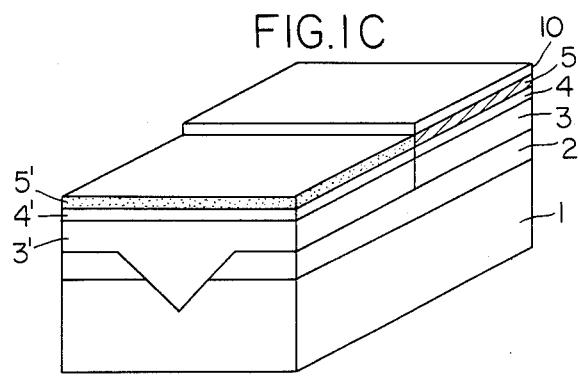

Thereafter, as shown in FIG. 1C, the remaining photoresistive layer 11 of the first region I is removed, and on the current blocking layer 2 including the V-channel 99 of the second region II, a p-$Ga_{1-x}Al_xAs$ cladding layer (x=0.5 to 0.6)3', a p-$Ga_{1-x}Al_xAs$ active layer (x=0.13; the thickness thereof being 0.1 $\mu$m)4', and an n-$In_{1-x}Ga_xP_{1-y}As_y$ optical guiding layer (x=0.66 and y=0.3; the thickness thereof being 0.2 $\mu$m)5' are successively grown by liquid phase epitaxy.

Figure 1D:
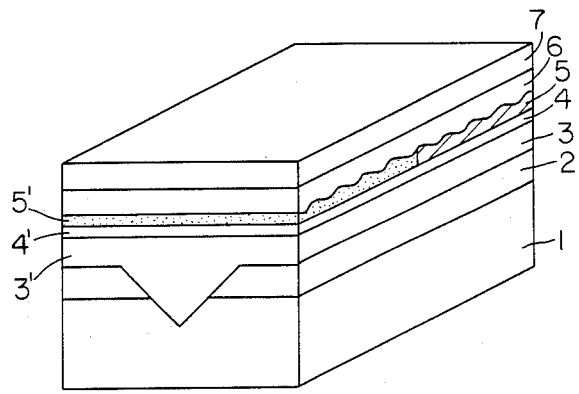

The remaining $Si_3N_4$ film 10 is then removed by a chemical etching technique, and on the top surfaces of the n-InGaPAs optical guiding layers 5 and 5' having the same thickness, 0.2 $\mu$m, a photoresistive layer (not shown) is formed, followed by exposing it to light with a periodically corrugated pattern by the laser interference and exposure method, and developing it. Then, as shown in FIG. 1D, the surface of each of the n-InGaPAs optical guiding layers 5 and 5' is etched with an etchant that is a mixture of saturated bromine water, phosphoric acid and water wherein the photoresistive layer with the above-mentioned periodic corrugation is used as a mask, resulting in a periodically corrugated pattern on the surfaces of the optical guiding layers 5 and 5'. The periodicity (or pitch) of the corrugation is 2300 Å and the depth of each concave portion of the corrugation is about 800 Å. Then, on the optical guiding layers 5 and 5' with the periodically corrugated pattern, an n-$Ga_{1-x}Al_xAs$ cladding layer (x=0.8)6 and a p-GaAs cap layer 7 are successively grown by liquid phase epitaxy.

Figure 1E:
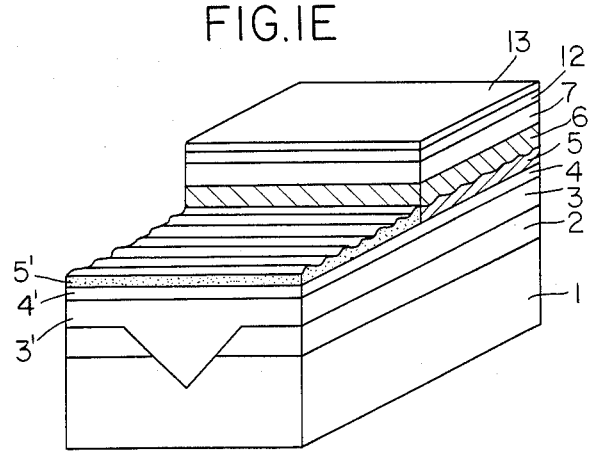

Then, as shown in FIG. 1E, a $Si_3N_4$ film 12 is formed on the p-GaAs cap layer 7 by plasma assisted chemical vapor deposition, followed by forming a photoresistive layer 13 on this $Si_3N_4$ film 12. Then, the portion of the photoresistive layer 13 of the second region II of the optical guiding area is removed by photolithography, and the wafer of the second region is etched by a chemical etching technology until the optical guiding layer 5' is exposed to the outside, wherein the remaining photoresistive layer 13 of the first region I of the optical guiding area functions as a mask. Buffered hydrofluoric acid is used for the removal of the $Si_3N_4$ layer 12, an etchant containing ammonia is used for the removal of the cap layer 7, and hydrofluoric acid is used for the removal of the GaAlAs cladding layer 6.

Figure 1F:
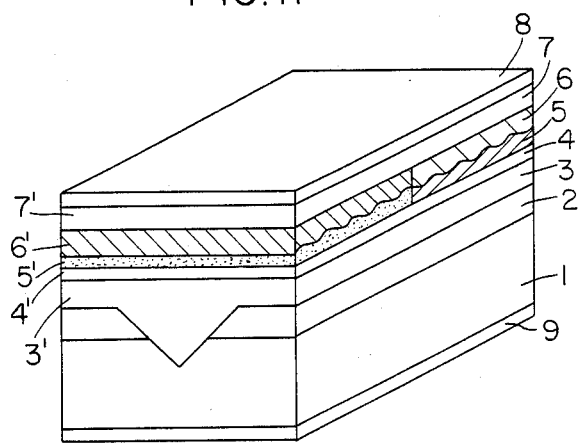
Figure 2:
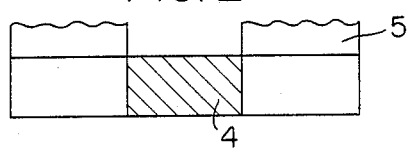
FIG. 2 is a schematic diagram showing the structure in the vicinity of the resonator region of a conventional distributed Bragg reflection laser device.
Figure 3:
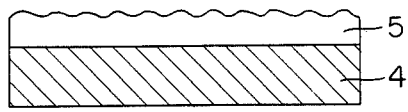
FIG. 3 is a schematic diagram showing the structure in the vicinity of the resonator region of a conventional distributed feedback laser device.
Figure 4:
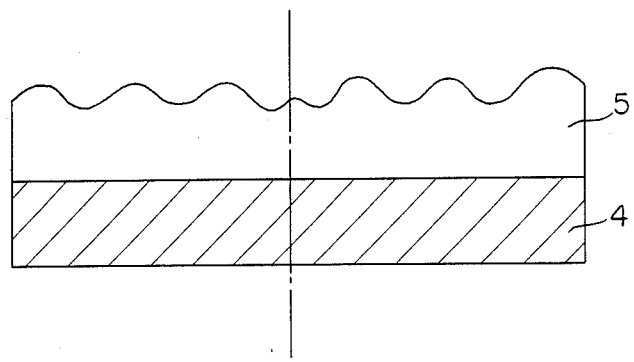
FIG. 4 is a schematic diagram showing a conventional distributed feedback laser device having a phase-shifted diffraction grating by which single-mode oscillation can be achieved.
Figure 5:
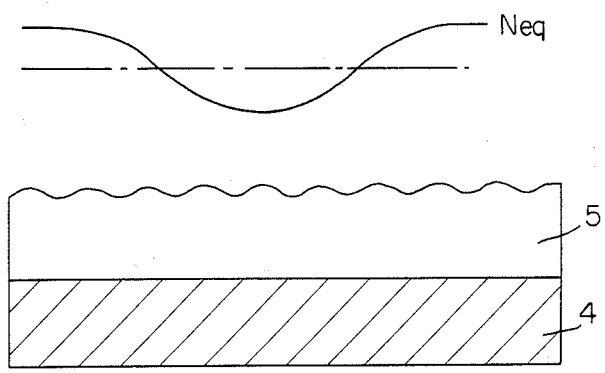
FIG. 5 is a schematic diagram showing a conventional distributed feedback laser device having an equivalent refractive index by which single-mode oscillation can be achieved, said refractive index varying symmetrically about the center of the axis of the resonator in the axial direction of the said resonator.

Then, the portion of the photoresistive layer 13 corresponding to the first region I of the optical guiding area is removed, and as shown in FIG. 1F, on the optical guiding layer 5' of the second region II of the optical guiding area, an n-$Ga_{1-x}Al_xAs$ cladding layer (x=0.5)6', and a p-GaAs cap layer 7' are successively grown by liquid phase epitaxy. Then, the remaining $Si_3N_4$ film 12 of the first region I of the optical guiding area is removed, and electrodes 8 and 9 are formed on the upper faces of the p-GaAs cap layers 7 and 7' and the back face of the p-GaAs substrate 1, respectively, resulting in a distributed feedback semiconductor laser device.

Both the periodicity and the depth of the periodic corrugated pattern functioning as a diffraction grating, which is formed on the surface of the optical guiding layer 5 (i.e., the first region I of the optical guiding area) of the distributed feedback semiconductor laser device produced by the above-mentioned process, are the same as those of the periodic corrugated pattern, which is formed on the surface of the optical guiding layer 5' (i.e., the second region II of the optical guiding area) of the said laser device. Moreover, the thickness of the optical guiding layer 5 is the same as that of the optical guiding layer 5', so that the effective refractive index of the first region I of the optical guiding area in the resonator direction becomes the same as that of the second region II of the optical guiding area in the resonator direction. Moreover, since the composition of the optical guiding layer 5 is different from that of the optical guiding layer 5', there is a difference in their refractive index at the interface between the first and second regions of the optical guiding area, resulting in an effective optical-phase shift therein.

As mentioned above, this invention can provide a laser device structure by which an optical phase-shaft arises without changing the Bragg wavelength in the propagation direction of laser light of the resonator.

Although the above-mentioned example only discloses a GaAs/InGaPAs distributed feedback semiconductor laser device, this invention is applicable to semiconductor laser devices made of compound semiconductor materials such as the InP/InGaAsP system. Moreover, although the optical guiding area of the laser device of the above-mentioned example is composed of the two regions, the optical guiding layers 5 and 5', this optical guiding area can be composed of three regions or more, whereby the same effect as the above-mentioned can be attained.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a distributed feedback semiconductor laser device with a resonator for laser oscillating operation comprising an optical guiding area with a periodic corrugation, said optical guiding area comprising at least two regions, a first region I and a second region II, having an interface therebetween, wherein both the periodicity of the corrugation and the depth of each concave portion of the corrugation of the first region I of said optical guiding area are the same as those of the second region II of said optical guiding area, and wherein the thickness of the first region I of said optical guiding area is the same as that of the second region II of said optical guiding area, so that the effective refractive index of the first region I in an oscillation direction becomes the same as that of the second region II in the oscillation direction and the Bragg wavelength is maintained at a fixed level over the entire area from said first region I to said second region II in the said oscillation direction; and there is a difference in their refractive index at an interface between the first and second regions of said optical guiding area, so that an effective optical-phase shift takes place without changing the Bragg wavelength in the oscillation direction.

2. A distributed feedback semiconductor laser device according to claim 1, wherein the position of the interface between the first and second regions of said optical guiding area is set arbitrarily in the direction vertical to said oscillation direction.

3. A distributed feedback semiconductor laser device according to claim 1, wherein said optical guiding area is an optical guiding layer.

4. A distributed feedback semiconductor laser device according to claim 1, wherein the composition of a semiconductor substance that constitutes the first region I of said optical guiding area is different from that of a semiconductor substance that constitutes the second region II of said optical guilding area, such that the difference in the refractive index between the first and second regions of said optical guiding area, results in an effective optical-phase shaft therein.

* * * * *